United States Patent
Horng et al.

(10) Patent No.: US 6,646,875 B1
(45) Date of Patent: Nov. 11, 2003

(54) AXLE TUBE STRUCTURE FOR A MOTOR

(75) Inventors: Alex Horng, Kaohsiung (TW); Yin-Rong Hong, Kaohsiung (TW); Ching-Sheng Horng, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 0 days.

(21) Appl. No.: 10/214,573

(22) Filed: Aug. 9, 2002

(51) Int. Cl.[7] ................................. G06F 1/20
(52) U.S. Cl. ................ 361/687; 361/756; 257/793; 439/61
(58) Field of Search .................. 361/687, 685, 361/724–727, 752–756, 800–802; 257/702, 746, 747, 788, 793, 795; 220/23.4, 23.6; 439/61–62

(56) References Cited

U.S. PATENT DOCUMENTS 5,158,912 A * 10/1992 Kellerman et al. ......... 361/687
5,550,403 A * 8/1996 Carichner ................... 257/702
5,585,671 A * 12/1996 Nagesh et al. .............. 257/697
5,864,467 A * 1/1999 Recchia et al. ............. 361/732

\* cited by examiner

Primary Examiner—Darren Schuberg
Assistant Examiner—Hung Van Duong
(74) Attorney, Agent, or Firm—Bacon & Thomas, PLLC

(57) ABSTRACT

A heat sink includes a plurality of adjoined heat-dissipating elements made of a thermally conductive material. Each of the elements has a flat lamina with a pair of first hems extending at a certain angle from two opposed sides of the flat lamina and a pair of second hems extending at a certain angle from the first hems. The second hems are substantially parallel to the flat lamina and are provided with respective first connectors. The flat lamina is provided with a plurality of second connectors mating with the first connectors. Therefore, the elements can be connected together by fastening the first connector of each element to the second connectors of the next element.

11 Claims, 6 Drawing Sheets

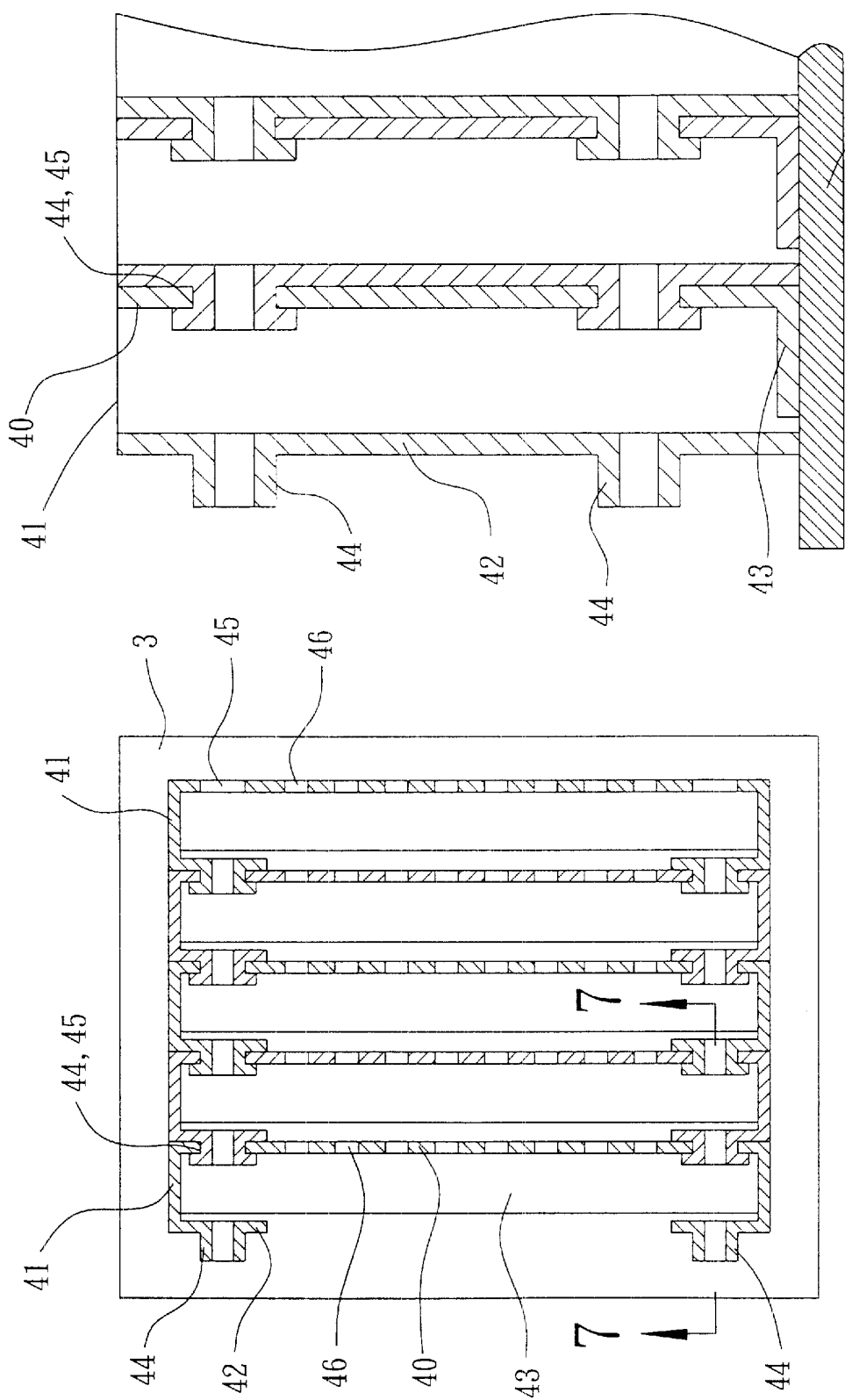

AXLE TUBE STRUCTURE FOR A MOTOR

BACKGROUND OF THE INVENTION

1. Field of the Invention

The present invention relates to a heat sink and, more particularly, to a heat sink in which a plurality of heat-dissipating elements can easily be connected together.

2. Description of Related Art

Heat sinks are widely used for Central Processing Units. As shown in FIG. 8, a heat sink includes a plurality of laminas 90 and a tube 96 extending through the laminas 90. Each of the laminas 90 consists of an upper member and a lower member, with each member having an outer flange 91 formed with a pair of first tenons 93 and an inner flange 92 formed with a second tenon 95.

The inner flange 92 is situated between a pair of lips 94, which are below the inner flange 92 for the upper member but above the inner flange 92 for the lower member. The two members of the same lamina 90 can be coupled to each other by connecting the lips 94 of the upper member to those 94 of the lower member. The achieved laminas 90 are then connected together by inserting the tenons 93, 95 of each lamina 90 into corresponding mortises of the next laminas 90. As a result of this connection, all of the inner flanges 92 define a channel in which the tube 96 is tightly received.

Although the conventional heat sink can be used to dissipate heat derived from a heat source, its laminas 90 are complex and not easy to be connected together.

OBJECT OF THE INVENTION

The object of the present invention is to provide a heat sink in which a plurality of heat-dissipating elements can easily be connected together.

SUMMARY OF THE INVENTION

The present invention provides a heat sink comprising a plurality of adjoined heat-dissipating elements made of a thermally conductive material. Each of the elements has a flat lamina with a pair of first hems extending at a certain angle from two opposed sides of the flat lamina and a pair of second hems extending at a certain angle from the first hems. The second hems are substantially parallel to the flat lamina and are provided with respective first connectors. The flat lamina is provided with a plurality of second connectors mating with the first connectors. Therefore, the elements can be connected together by fastening the first connector of each element to the second connectors of the next element.

Other objects, advantages and novel features of this invention will become more apparent from the following detailed description when taken in conjunction with the accompanying drawings.

BRIEF DESCRIPTION OF THE DRAWINGS

FIG. 6 is a cross-sectional top view of the heat sink of FIG. 5;

FIG. 7 is an enlarged cross-sectional view taken along lines 7—7 in Fig . 6.

DETAILED DESCRIPTION OF THE PREFERRED EMBODIMENT

Figure 1:
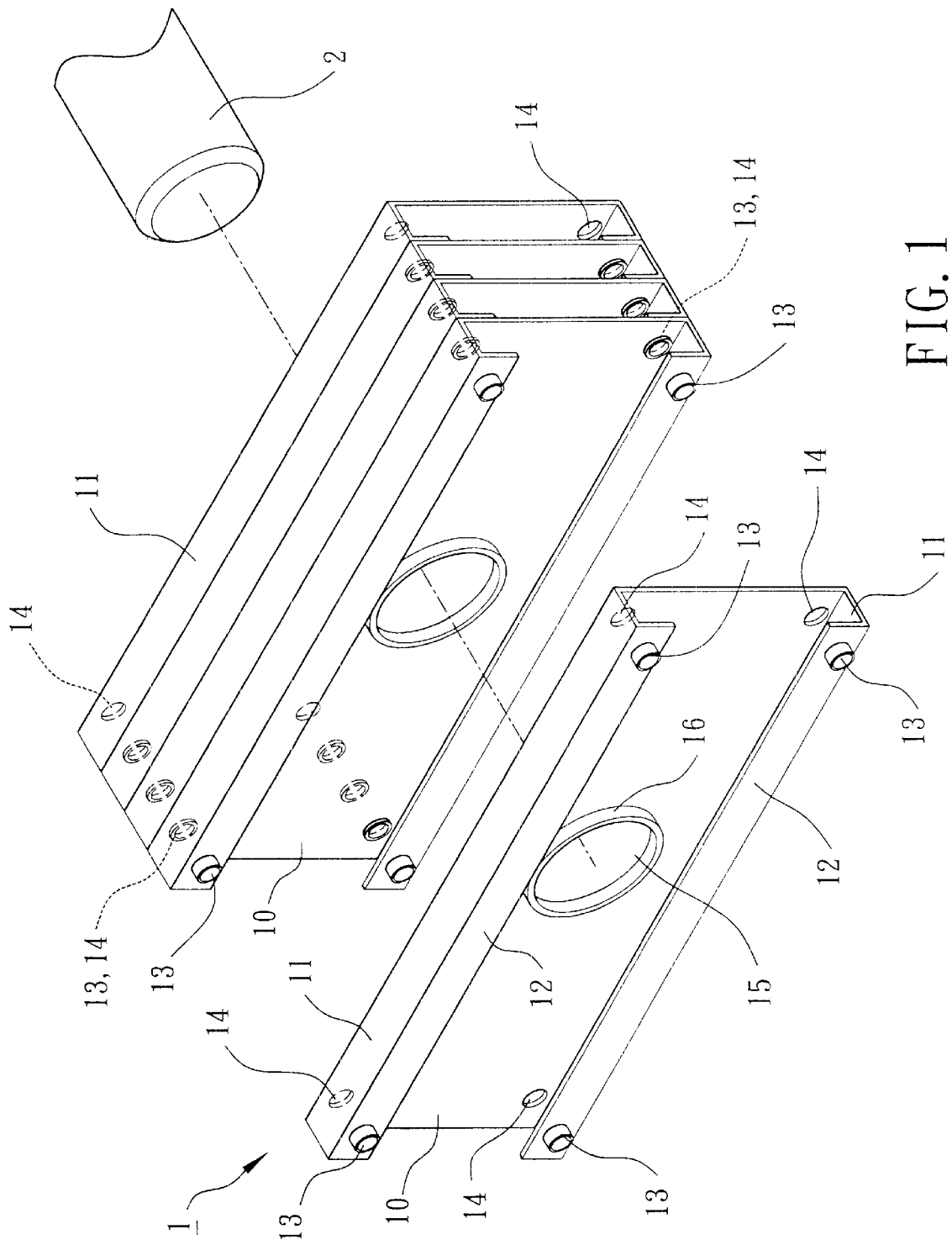
FIG. 1 is an exploded perspective view of a first embodiment of a heat sink in accordance with the present invention.

Referring to FIG. 1, a first embodiment of a heat sink in accordance with the present invention is shown . The inventive heat sink includes a plurality of heat-dissipating elements 1 adjoined one to another and a heat conductor 2 extending through the elements 1.

Each of the heat-dissipating elements 1 is made of a thermally conductive material, such as copper. Each elements 1 has a flat lamina 10 with a pair of first hems 11 extending at a certain angle from two opposed sides of the flat lamina 10 and a pair of second hems 12 extending at a certain angle from the first hems 11. These angles are preferably selected so that the two second hems 12 are substantially parallel to the flat lamina 10. For example, the second hems 12 may make a right angle with respective first hems 11 that in turn make a right angle with the flat lamina 10.

Furthermore, the second hems 12 are provided with respective first connectors, preferably configured as tubular stubs 13 integrally projecting from the hems 12. The flat lamina 10 is provided with a plurality of second connectors, preferably configured as holes 14, th at mate with the first connectors 13.

Figure 2:
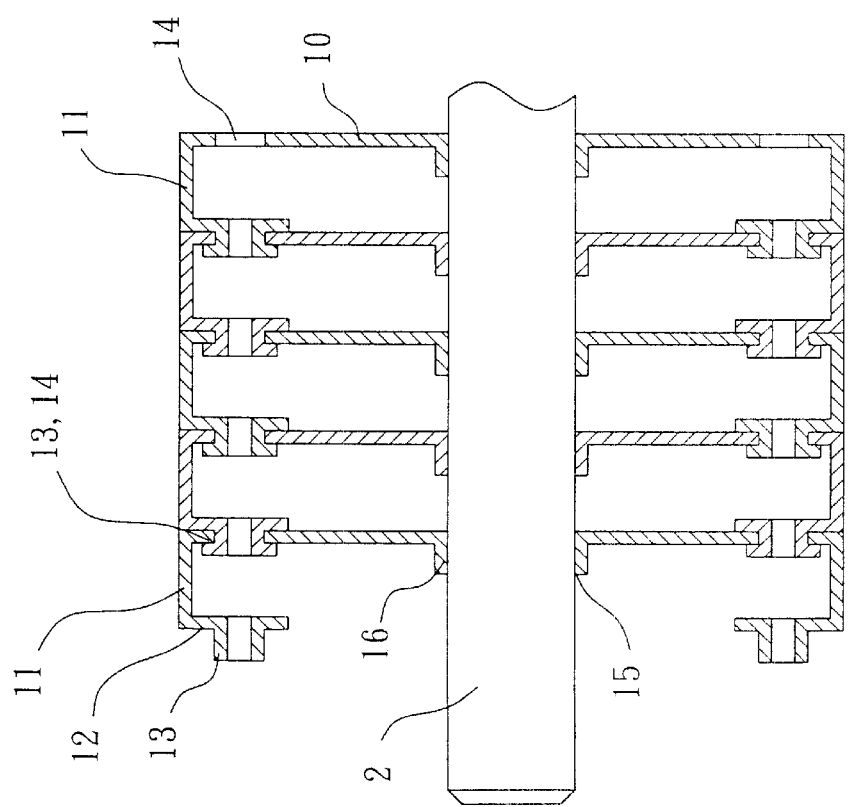
FIG. 2 is a cross-sectional side view of the heat sink of FIG. 1.

Referring to FIG. 2, the heat-dissipating elements 1 are connected by inserting the tubular stubs 13 of each element 1 in to the holes 14 of the next element 1. These tubular stubs 13 can be then fastened to the related holes 14, such as by enlarging distal ends of the stubs 13, so as to fixedly and permanently connect the elements 1 together. As a result of the connection, all of the laminas 10 are spaced one from another by the first hems 11 that extend between the laminas 10 and the second hems 12, thereby enabling the inventive heat sink to dissipate heat efficiently.

As can be seen, each of the elements 1 further has an opening 15 defined in the flat lamina 10 for receiving the heat conductor 2. Preferably, the opening 15 is surrounded by a collar 16 to make an improved thermal contact with the conductor 2. This improved thermal contact allows heat to be quickly conducted from the conductor 2 to the heat-dissipating elements 1, where the heat can be dissipated quickly.

Figure 3:
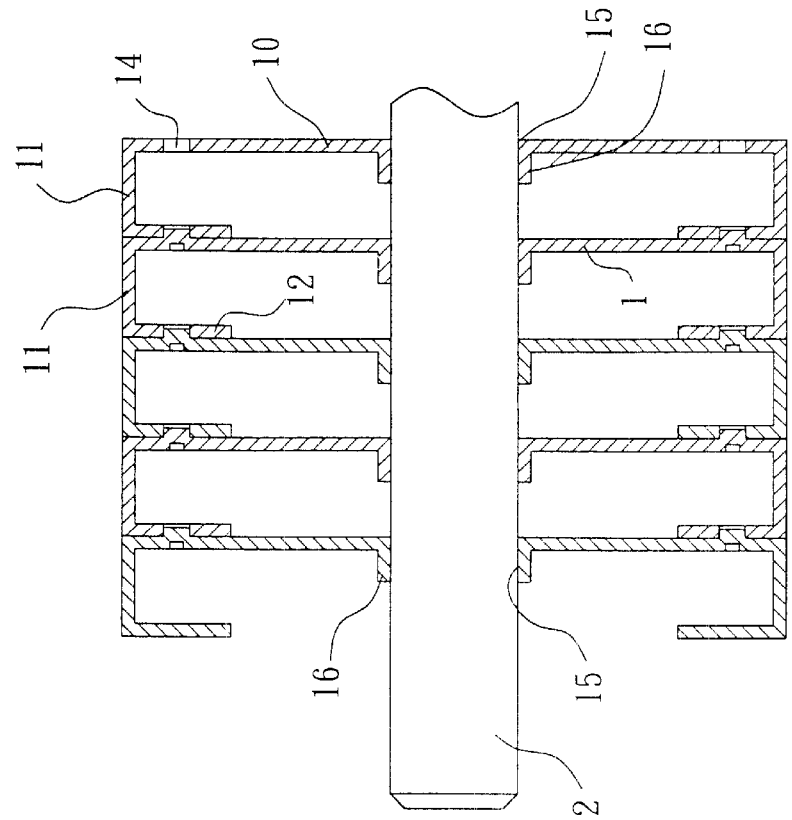
FIG. 3 is a cross-sectional side view of a second embodiment of the inventive heat sink.

Referring to FIG. 3, a second embodiment of the inventive heat sink is shown now. Each element 1 here is also made of a thermally conductive material, and each of the elements 1 has a flat lamina 10 with a pair of first hems 11 extending at a certain angle from two opposed sides of the flat lamina 10 and a pair of second hems 12 extending from the first hems 11. The second hems 12 makes such an angle with the first hems 11 that the two second hems 12 are substantially parallel to the flat lamina 10. In addition, each of the elements 1 has an opening 15 surrounded by a collar 16 in thermal contact with a conductor 2.

In this embodiment, however, the flat lamina 10 is provided with a plurality of second connectors configured as holes 14 while the second hems 12 are provided with a plurality of first connectors configured as stubs 13 that are tightly fitted in the holes 14 of the next element 1, thus connecting the elements 1 together.

As a result, all of the laminas 10 are spaced one from another by the first hems 11 and hence enables the inventive heat sink to dissipate heat efficiently.

Figure 4:
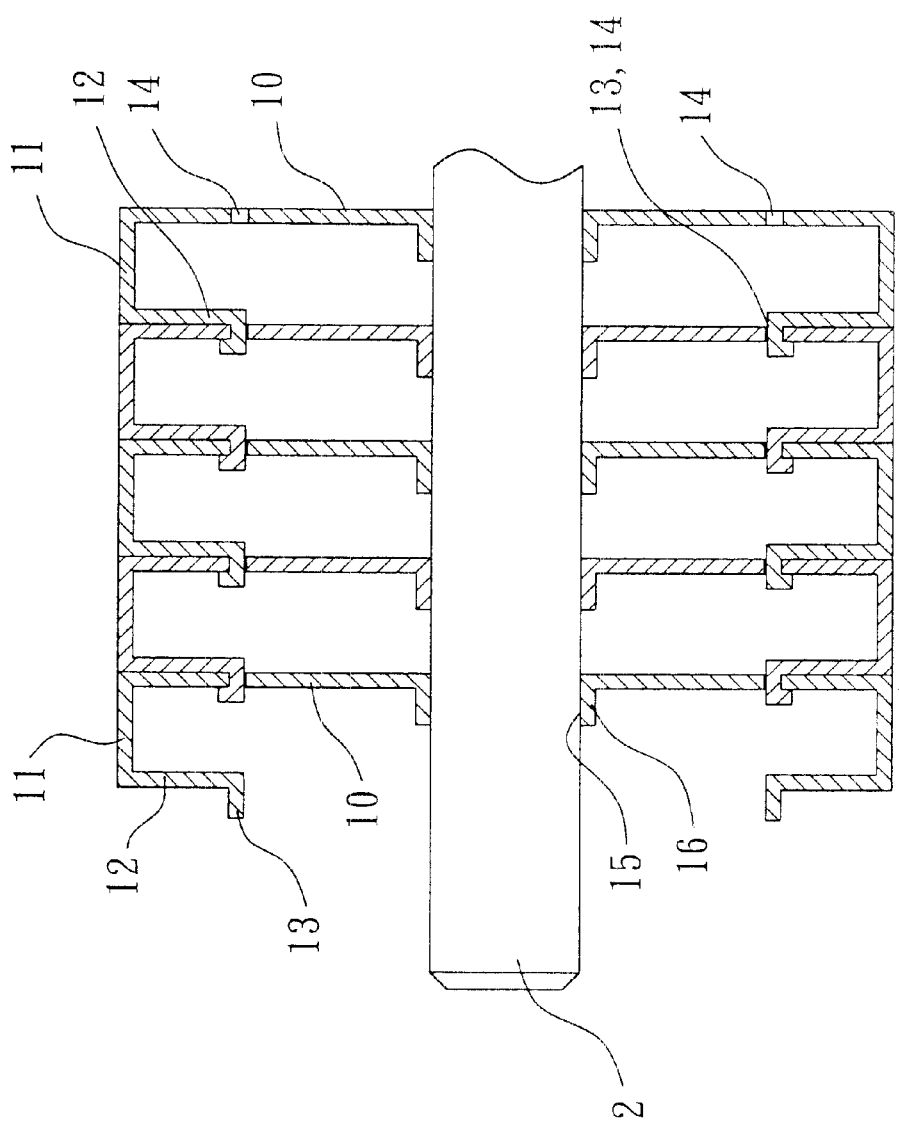
FIG. 4 is a cross-sectional side view of a third embodiment of the inventive heat sink.

Referring to FIG. 4, a third embodiment of the inventive heat sink is shown now. Here again each element 1, also made of a thermally conductive material, has a flat lamina 10 with a pair of first hems 11 extending at a certain angle from two opposed sides of the flat lamina 10 and a pair of second hems 12 extending from the first hems 11. The second hems 12 makes such an angle with the first hems 11 that the two second hems 12 are substantially parallel to the flat lamina 10. Additionally, each of the elements 1 has an opening 15 surrounded by a collar 16 which is in thermal contact with a conductor 2.

Now the flat lamina 10 is provided with a plurality of second connectors configured as holes 14, while the second hems 12 are provided with first connectors 13 which extend laterally from the second hems 12 into the holes 14 of the next element 1 In this configuration, the elements 1 are permanently connected together once distal ends of the first connectors 13 are bent up.

This connection causes all of the laminas 10 to be spaced one from another by the first hems 11, and so the inventive heat sink can dissipate heat efficiently.

Figure 5:
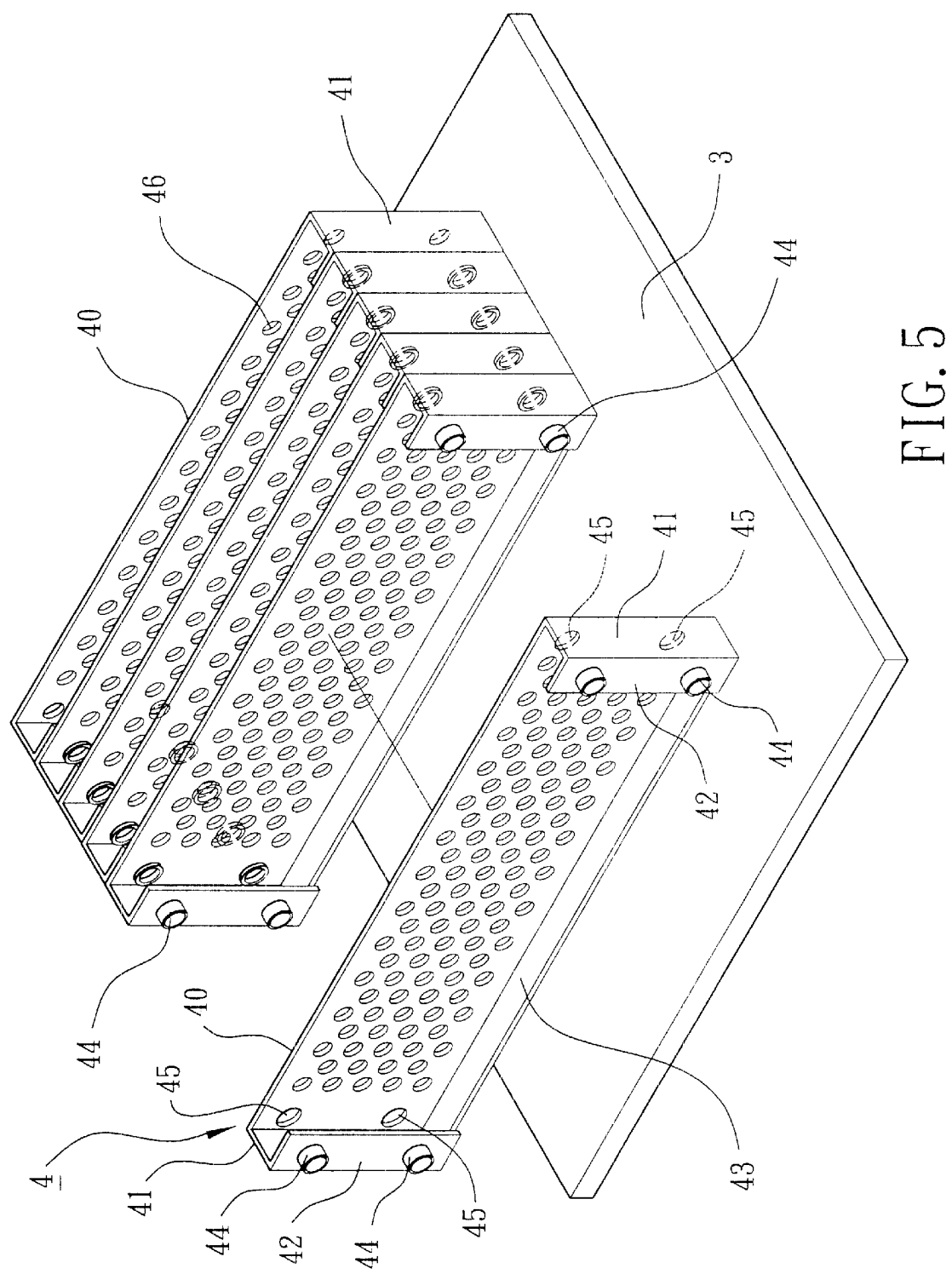
FIG. 5 is an exploded perspective view of a fourth embodiment of the inventive heat sink.
Figure 8:
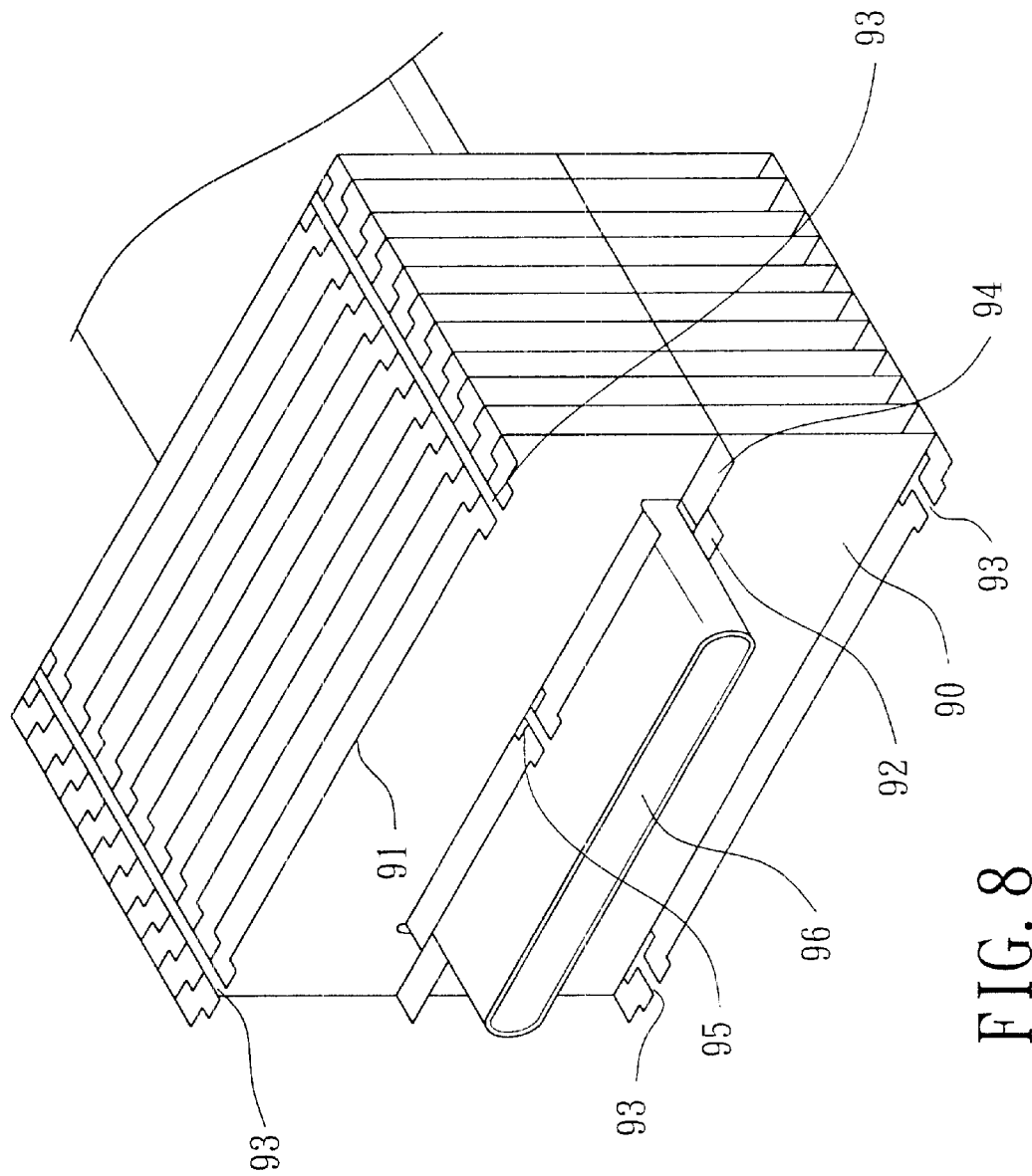
FIG. 8 is a perspective view of a conventional heat sink.

Referring to FIG. 5, a fourth embodiment of the inventive heat sink is shown. The heat sink here includes a plurality of heat-dissipating elements 4 adjoined one to another and each made of a thermally conductive material, such as copper.

Each of the elements 4 has a flat lamina 40 with a pair of first hems 41 extending at a certain angle from two opposed sides of the flat lamina 40 and a pair of second hems 42 extending from the first hems 41. The second hems 42 makes such an angle with the first hems 41 that the two second hems 42 are substantially parallel to the lamina 40.

In the fourth embodiment, the flat lamina 40 is formed with a plurality of vents 46 defined therein for passing airflow and with a bent edge 43 extending between the two first hems 41. The bent edge 43, preferably making a right angle with the lamina 40, is in thermal contact with a heat conductor plate 3, and so heat can be conducted from the plate 3 to the element 4 through the edge 43 and then be quickly dissipated by airflow passing through the vents 46.

Referring to FIGS. 6 and 7, the second hems 42 are further provided with respective first connectors, preferably configured as tubular stubs 44. And the flat lamina 40 is provided with a plurality of second connectors, preferably configured as holes 45, that mate with the first connectors.

Therefore, the heat-dissipating elements 4 can be connected together by inserting the tubular stubs 44 of each element 4 into the holes 45 of the next element 4 before distal ends of the stubs 44 are enlarged, as best shown in FIG. 7.

From the foregoing, it is apparent that this invention has the advantage of enabling the heat-dissipating elements to be easily connected together.

While the principles of this invention have been disclosed in connection with specific embodiments, it should be understood by those skilled in the art that these descriptions are not intended to limit the scope of the invention, and that any modification and variation without departing the spirit of the invention is intended to be covered by the scope of this invention defined only by the appended claims.

What is claimed is:

1. A heat sink comprising a plurality of adjoined heat-dissipating elements made of a thermally conductive material, each of said elements having a flat lamina with a pair of first hems extending at a certain angle from two opposed sides of said flat lamina and a pair of second hems extending at a certain angle from said first hems, said second hems being substantially parallel to said flat lamina and being provided with respective first connectors, and said flat lamina being provided with a plurality of second connectors mating with said first connectors, whereby said elements may be connected together by fastening said first connector of each element to said second connectors of the next element.

2. The heat sink as claimed in claim 1, wherein said pair of first hems makes a right angle with said flat lamina, and said pair of second hems makes a right angle with said first hems.

3. The heat sink as claimed in claim 1, wherein said first connectors are configured as tubular stubs, and wherein said second elements are configured as holes.

4. The heat sink as claimed in claim 1, wherein said second connectors are configured as holes, and wherein said first connectors integrally project from said second hems and extendable into said holes of said next element.

5. The heat sink as claimed in claim 1, wherein said second connectors are configured as holes, and wherein said first connectors extend laterally from said second hems into said holes of said next element.

6. The heat sink as claimed in claim 1, wherein each of said elements has an opening for receiving a heat conductor.

7. The heat sink as claimed in claim 1, wherein said flat lamina has a bent edge extending between said first hems, and wherein said bent edge is in thermal contact with a heat conductor plate.

8. The heat sink as claimed in claim 1, wherein each of said elements has a plurality of vents defined therein.

9. The heat sink as claimed in claim 3, wherein said first connectors are fastened to said second connectors by enlarging distal ends of said first connectors.

10. The heat sink as claimed in claim 3, wherein said first connectors are fastened to said second connectors by tight fitting said first connectors in said second connectors.

11. The heat sink as claimed in claim 6, wherein each of said elements has a collar surrounding said opening for making an improved thermal contact with said heat conductor.

* * * * *